United States Patent
Shi et al.

(10) Patent No.: US 9,911,728 B2
(45) Date of Patent: *Mar. 6, 2018

(54) TRANSIENT VOLTAGE SUPPRESSOR (TVS) WITH REDUCED BREAKDOWN VOLTAGE

(71) Applicant: Alpha and Omega Semiconductor Incorporated, Sunnyvale, CA (US)

(72) Inventors: Ning Shi, Milpitas, CA (US); Lingpeng Guan, Sunnyvale, CA (US); Madhur Bobde, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/445,640

(22) Filed: Feb. 28, 2017

(65) Prior Publication Data

US 2017/0179107 A1    Jun. 22, 2017

Related U.S. Application Data

(63) Continuation of application No. 14/979,208, filed on Dec. 22, 2015, now Pat. No. 9,583,586.

(51) Int. Cl.

| | |
|---|---|
| H01L 21/00 | (2006.01) |
| H01L 29/66 | (2006.01) |
| H01L 27/02 | (2006.01) |
| H01L 29/74 | (2006.01) |
| H01L 29/06 | (2006.01) |
| H01L 29/87 | (2006.01) |
| H01L 29/86 | (2006.01) |

(52) U.S. Cl.
CPC ...... *H01L 27/0248* (2013.01); *H01L 27/0255* (2013.01); *H01L 29/0626* (2013.01); *H01L 29/0649* (2013.01); *H01L 29/66113* (2013.01); *H01L 29/7424* (2013.01); *H01L 29/86* (2013.01); *H01L 29/87* (2013.01)

(58) Field of Classification Search
CPC ................................. H01L 29/66113
USPC ................... 257/186, 199; 438/91, 380, 526
See application file for complete search history.

(56) References Cited

U.S. PATENT DOCUMENTS

| | | |
|---|---|---|
| 7,892,924 B1 | 2/2011 | Lee et al. |
| 8,680,613 B2 | 3/2014 | Guan et al. |
| 8,785,279 B2 | 7/2014 | Bhalla et al. |
| 8,809,948 B1 | 8/2014 | Yilmaz et al. |
| 8,822,300 B2 * | 9/2014 | Guan ............ H01L 27/0255 438/380 |
| 8,933,506 B2 | 1/2015 | Bobde et al. |
| 8,946,816 B2 | 2/2015 | Bobde et al. |
| 8,951,867 B2 | 2/2015 | Lee et al. |

(Continued)

*Primary Examiner* — Calvin Lee
(74) *Attorney, Agent, or Firm* — JDI Patent; Joshua Isenberg; Robert Pullman

(57) ABSTRACT

A low capacitance transient voltage suppressor with snap-back control and a reduced voltage punch-through breakdown mode includes an n+ type substrate, a first epitaxial layer on the substrate, a buried layer formed within the first epitaxial layer, a second epitaxial layer on the first epitaxial layer, and an implant layer formed within the first epitaxial layer below the buried layer. The implant layer extends beyond the buried layer. A set of source regions is formed within a top surface of the second epitaxial layer. Implant regions are formed in the second epitaxial layer, with a first implant region located below the first source region.

15 Claims, 15 Drawing Sheets

(56) References Cited

U.S. PATENT DOCUMENTS

| | | |
|---|---|---|
| 9,000,481 B2 | 4/2015 | Guan et al. |
| 9,064,897 B2 | 6/2015 | Guan et al. |
| 9,082,790 B2 | 7/2015 | Bobde et al. |
| 9,105,494 B2 | 8/2015 | Lee et al. |
| 9,129,822 B2 | 9/2015 | Bhalla et al. |
| 9,136,380 B2 | 9/2015 | Yilmaz et al. |
| 9,153,653 B2 | 10/2015 | Padmanabhan et al. |
| 9,190,512 B2 | 11/2015 | Lee et al. |
| 9,224,852 B2 | 12/2015 | Guan et al. |
| 9,252,264 B2 | 2/2016 | Bobde et al. |
| 9,391,061 B2 | 7/2016 | Guan et al. |
| 9,412,733 B2 | 8/2016 | Calafut et al. |
| 9,450,083 B2 | 9/2016 | Bhalla et al. |
| 9,450,088 B2 | 9/2016 | Lee et al. |
| 9,484,452 B2 | 11/2016 | Bobde et al. |
| 9,484,453 B2 | 11/2016 | Yilmaz et al. |
| 9,502,554 B2 | 11/2016 | Bobde et al. |
| 9,530,885 B2 | 12/2016 | Bobde et al. |
| 9,543,413 B2 | 1/2017 | Guan et al. |
| 9,577,072 B2 | 2/2017 | Guan et al. |
| 9,583,586 B1 * | 2/2017 | Shi ............ H01L 29/66113 438/91 |
| 2012/0193676 A1 | 8/2012 | Bobde et al. |
| 2014/0027819 A1 | 1/2014 | Guan et al. |
| 2014/0027840 A1 | 1/2014 | Guan et al. |
| 2014/0027841 A1 | 1/2014 | Bhalla et al. |
| 2014/0134825 A1 | 5/2014 | Guan et al. |
| 2014/0193958 A1 | 7/2014 | Guan et al. |
| 2014/0231963 A1 | 8/2014 | Guan et al. |
| 2014/0319604 A1 | 10/2014 | Bhalla et al. |
| 2014/0363946 A1 | 12/2014 | Guan et al. |
| 2015/0021682 A1 | 1/2015 | Bobde et al. |
| 2015/0137227 A1 | 5/2015 | Bobde et al. |
| 2015/0162410 A1 | 6/2015 | Padmanabhan et al. |
| 2015/0279984 A1 | 10/2015 | Guan et al. |
| 2015/0279989 A1 | 10/2015 | Bobde et al. |
| 2015/0372129 A1 | 12/2015 | Bhalla et al. |
| 2016/0141411 A1 | 5/2016 | Bobde et al. |
| 2016/0300833 A1 | 10/2016 | Guan et al. |
| 2016/0351659 A1 | 12/2016 | Bhalla et al. |

\* cited by examiner

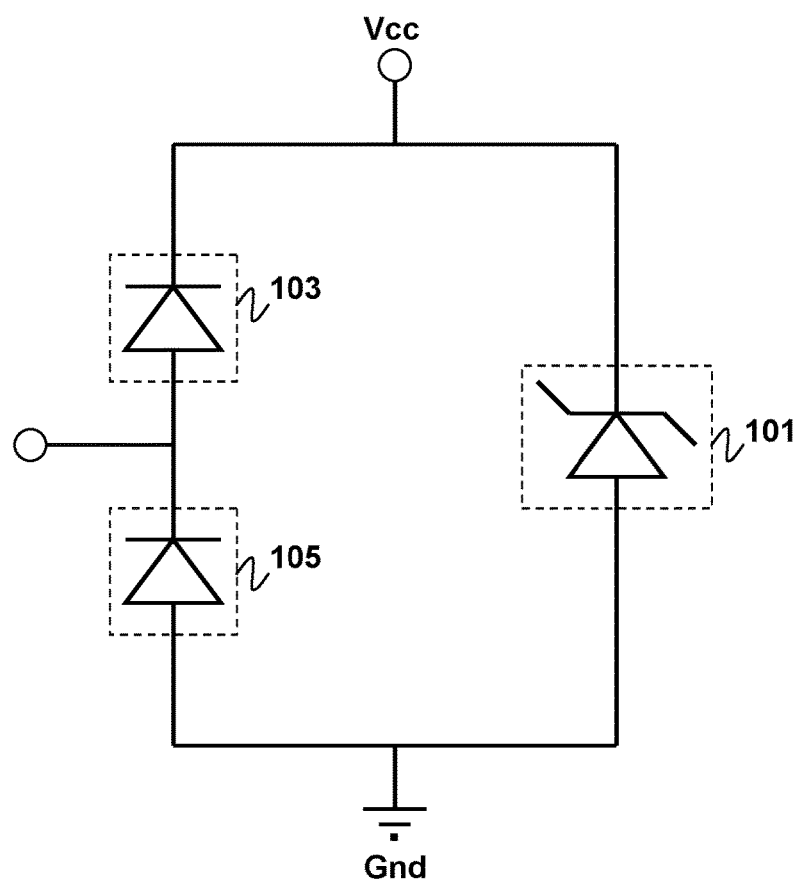
FIG. 1 – Prior Art

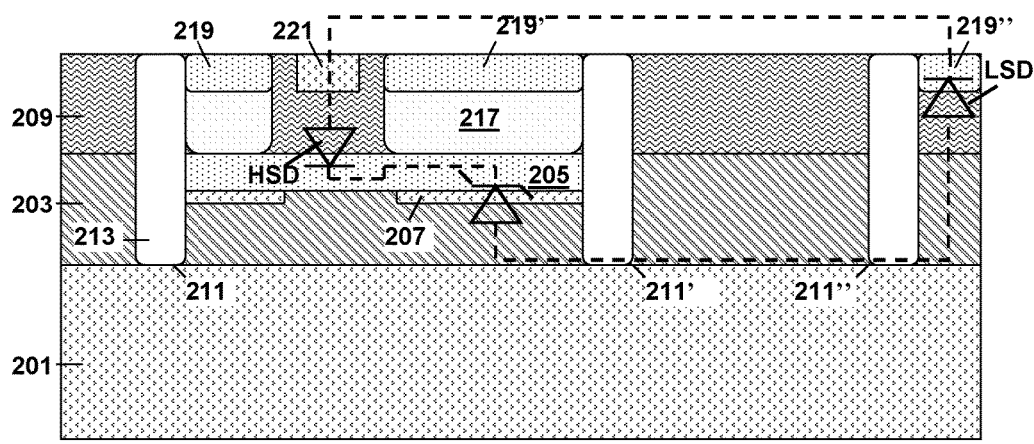
FIG. 2A – Prior Art

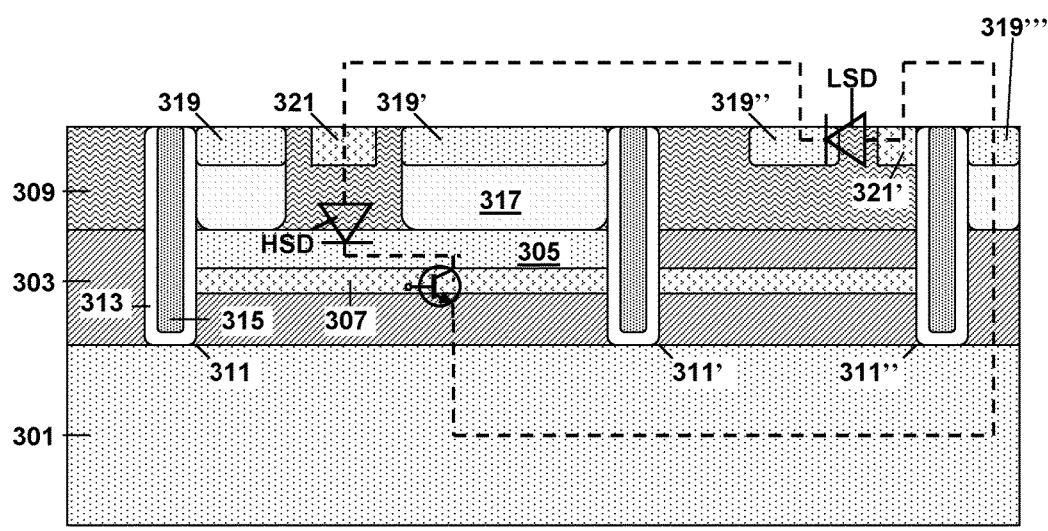
FIG. 2B – Prior Art

US 9,911,728 B2

TRANSIENT VOLTAGE SUPPRESSOR (TVS) WITH REDUCED BREAKDOWN VOLTAGE

CLAIM OF PRIORITY

This Application is a continuation of U.S. patent application Ser. No. 14/979,208, filed Dec. 22, 2015, now U.S. Pat. No. 9,583,586 issued Feb. 28, 2017, the entire disclosures of which are incorporated herein by reference.

FIELD OF THE DISCLOSURE

This disclosure relates to integrated circuits and more specifically to a transient voltage suppressor (TVS).

BACKGROUND OF INVENTION

Transient voltage suppressors (TVS) are devices used to protect integrated circuits from damages caused by over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to provide protection to circumvent the damages that are likely to occur to the integrated circuits when such over voltage conditions occur. As an increasing number of devices are implemented with integrated circuits that are vulnerable to over voltage damages, demands for TVS protection are also increased. Exemplary applications of TVS can be found in USB power and data line protection, digital video interfaces, high speed Ethernet, Notebook computers, monitors and flat panel displays.

FIG. 1 shows a conventional TVS circuit implemented with a diode array commonly applied for electrostatic discharge (ESD) protection of high bandwidth data buses. The TVS circuit 100 includes a main Zener diode 101 operated with two sets of steering diodes, i.e., the high-side steering diode 103 and the low-side steering diode 105. The high side steering diode 103 connects to the voltage source $V_{cc}$ and the low side steering diode 105 connects to the ground terminal Gnd with an input/output port I/O connected between the high side and low side steering diodes. The Zener diode 101 has a large size and functions as an avalanche diode from the high voltage terminal, i.e., terminal $V_{cc}$ to the ground voltage terminal, i.e., terminal Gnd. At a time when a positive voltage strikes the I/O (input/output) terminal, the high side diode provides a forward bias and is clamped by the large Zener diode.

Several device characteristics are desirable in such a TVS. A low TVS clamping voltage is desired to better protect an integrated circuit connected to the TVS. A low clamping voltage ensures that any electrostatic discharge (ESD) will be diverted from the integrated circuit. The device clamping voltage is highly dependent on the breakdown voltage of the Zener/Avalanche diode. Thus, it is also desirable to maintain a low breakdown voltage at the Zener/Avalanche diode in order to improve clamping voltage. The term Zener and Avalanche will be used interchangeably hereinafter to describe a diode that exhibits avalanche breakdown properties. In addition to having a low clamping voltage, and low avalanche diode breakdown voltage, it is also desirable to have an extremely low overall device capacitance. A low device capacitance translates to higher allowable bandwidth and reduction of insertion loss during device operation. It is also desirable to reduce die package size of such TVS devices in order to reduce costs and maintain compatibility with shrinking integrated circuits.

With current TVS devices, there is still a further demand to reduce die size, to reduce device capacitance, and to improve breakdown voltage and clamping voltage characteristics. Therefore, there is a need to provide new and improved device configurations with new structural layouts and manufacturing methods to achieve these goals.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIG. 1 is a circuit diagram illustrating a conventional transient voltage suppressor (TVS) circuit with a diode array in parallel with an avalanche diode.

FIG. 2A is a cross-sectional schematic diagram illustrating a conventional transient voltage suppressor (TVS) device in accordance with the prior art.

FIG. 2B is a cross-sectional schematic diagram illustrating an alternative transient voltage suppressor (TVS) device in accordance with the prior art.

DESCRIPTION OF THE SPECIFIC EMBODIMENTS

Introduction

Figure 3A:
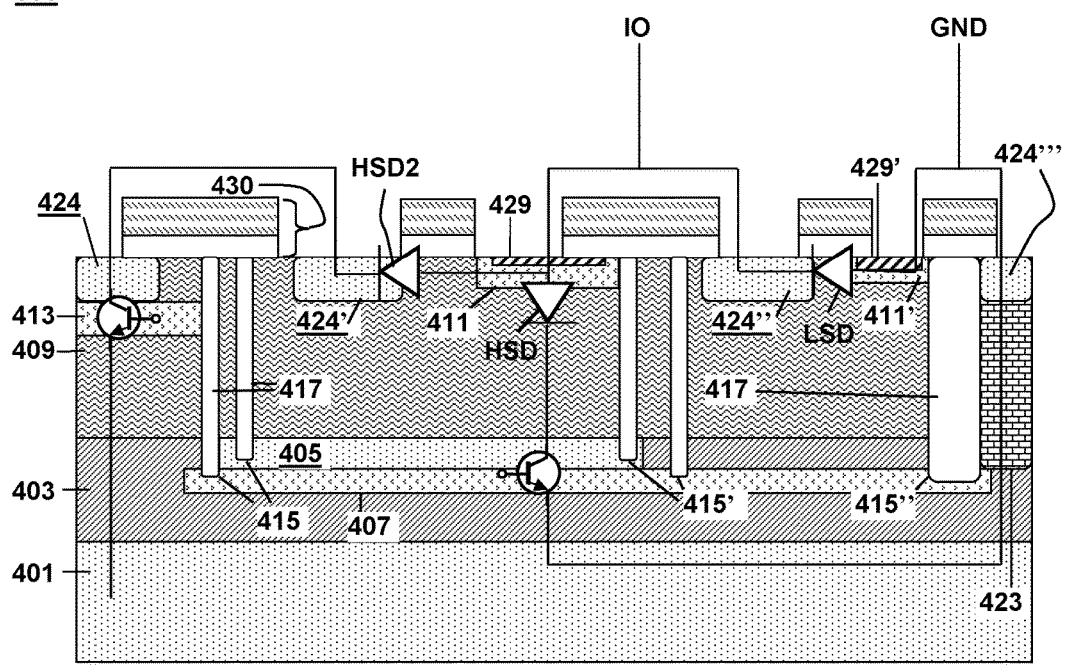
FIG. 3A is a cross-sectional schematic diagram illustrating a transient voltage suppressor (TVS) device in accordance with an alternative embodiment of the present invention.

FIG. 2A is a cross-sectional schematic diagram illustrating a conventional transient voltage suppressor (TVS) device 200 in accordance with the prior art. This conventional TVS 200 behaves in accordance with the TVS 100 described above in the circuit diagram of FIG. 1.

The TVS 200 is formed on a heavily doped p+ semiconductor substrate 201 which supports a lightly p-doped first epitaxial layer 203 and an even more lightly p-doped second epitaxial layer 209. Because the doping concentration of the second epitaxial layer 209 contributes significantly to the capacitance of both the high-side steering diode HSD and low-side steering diode LSD it is desirable to set the doping concentration of this layer 209 as low as possible (capacitance is directly proportional to doping concentration). The capacitances of the steering diodes HSD, LSD will contribute significantly to the overall capacitance of the TVS 200 because the steering diodes HSD, LSD are connected in parallel with the Zener diode. Thus, the capacitances of the steering diodes HSD, LSD may be used to effectively lower the overall TVS capacitance to a desired value regardless of the capacitance of the Zener diode.

An n+ buried layer 205 formed within the first epitaxial layer 203 acts as the cathode of a high-side steering diode HSD. A p+ implant layer 207 within the first epitaxial layer 203 below the n+ buried layer 205 is partitioned into two segments with a gap under the high side steering diode HSD in order to avoid a high doping layer underneath the high-side steering diode HSD. The Zener diode is formed by the n+ buried layer 205, the p+ implant layer 207, the first epitaxial layer 203, and the p+ substrate 201. The n+ buried layer 205 forms the cathode of the Zener diode and the p+ implant layer 207, first epitaxial layer 203, and p+ substrate 201 collectively form the anode of the Zener diode. A set of isolation trenches 211, 211', 211" formed isolate the low-side steering diode LSD from the high-side steering diode HSD integrated with the Zener diode.

First, second, and third n+ source regions 219, 219', 219" are formed within the second epitaxial layer 209. The first and second source regions 219, 219' are located adjacent the right sidewall of the first isolation trench 211 and left sidewall of the second isolation trench 211' respectively, as illustrated. The third source region 219" is located adjacent the right sidewall of the third isolation trench 211". The vertical low-side steering diode LSD is formed by the third source region 219", the second epitaxial layer 209, the first epitaxial layer 203 and the substrate 201. The second epitaxial layer 209, first epitaxial layer 203, and substrate 201 collectively form the anode of the low-side steering diode LSD and the third source region 219" forms the cathode of the low-side steering diode LSD. The anode of the low-side steering diode LSD is electrically connected to the anode of the Zener diode through the substrate 201.

A p+ implant region 221 formed within the top layer of the second epitaxial layer 209 between the first and second source regions 219, 219', the second epitaxial layer 209 and the n+ buried layer 205 form the high side steering diode HSD. The p+ implant region 221 and second epitaxial layer 209 collectively form the anode of the high side steering HSD diode and the n+ buried layer 205 forms the cathode of the high side steering diode HSD. The cathode of the high side steering diode HSD is electrically connected to the cathode of the Zener diode through the n+ buried layer 205.

Additionally, an isolation layer (not shown) may be formed above the second epitaxial layer 209 with openings formed therein to provide for metal contacts. A Vcc pad (not shown) may make contact to the second source region 219' above the Zener diode through an opening in the isolation layer. An n-type sinker region 217 may be formed between the second source region 219' and the n+ buried layer 205 to allow the Zener diode to form a connection at the top surface of the device 200. In reverse mode, the n-type sinker region 217 acts as part of a PN junction that can be used to improve the clamping performance of an N+ source to the substrate 201 both in positive and negative mode. An I/O pad (not shown) may make contact to the p+ implant region 221 (i.e., anode of high-side steering diode) through another opening in the isolation layer. Additionally, a second I/O pad (not shown) may make contact to the third source region 219" (i.e., cathode of low-side steering diode) through yet another opening in the isolation layer.

As illustrated, the conventional TVS 200 operates and functions as described above with respect to the circuit diagram in FIG. 1. This conventional TVS 200 exhibits several desirable device characteristics. For one, the conventional TVS 200 is built on a p-type substrate 201, which allows for the substrate to act as ground, facilitating easier integration of the steering diodes HSD, LSD and the Zener diode. Additionally, the conventional TVS 200 exhibits low capacitance due to light doping of the second epitaxial layer 209 as well as a small device package size attributed to vertical integration of the steering diodes and Zener diode.

While the conventional TVS 200 exhibits several desirable device characteristics, it continues to suffer from certain undesirable device performance characteristics that render it non-ideal. For all TVS devices, a low clamping voltage is desired in order to provide better protection to an integrated circuit connected to it. The clamping voltage of the TVS is directly proportional to the breakdown voltage of the Zener diode, and as such is limited by the breakdown characteristics of the Zener diode.

The doping concentration of the p+ implant layer 207 at the Zener diode junction determines the breakdown voltage of the Zener diode. While increasing the doping concentration of the p+ implant layer will lower the Zener diode breakdown voltage, there is a certain threshold whereby further increasing the doping concentration will lead to significant reverse leakage current that has the potential to destroy the device. As such, in the conventional TVS 200, it is difficult to implement a Zener diode breakdown voltage below 6V. With several existing applications requiring a Vcc of 3V or less, such a TVS 200 is insufficient. Thus, it is desirable to fabricate a TVS device with improved breakdown voltage and clamping voltage characteristics, while maintaining the low capacitance and small device package size of the conventional TVS 200.

Alternative TVS Devices

TVS devices with improved breakdown voltage characteristics, and hence improved clamping voltage characteristics, are provided in the commonly-assigned U.S. Pat. No. 8,698,196, attributed to Lingpeng Guan, et al., the entire disclosure of which is herein incorporated by reference. Devices such as those disclosed in the cited prior art reference have achieved improved breakdown voltage characteristics by implementing an N-P-N structure, rather than a Zener diode to function as an avalanche diode. FIG. 2B illustrates an example of such a TVS device 200'. Instead of a p+ substrate, the TVS device 200' is formed on an n+ substrate 301 to facilitate integration of the N-P-N avalanche diode. An n+ buried layer 305 formed within a first epitaxial layer 303 forms the cathode of the high-side steering diode HSD. A p+ implant layer 307 within the first epitaxial layer 303 below the n+ buried layer 305 extends laterally beyond the n+ buried layer 305. The avalanche diode is formed by the n+ buried layer 305, the p+ implant layer 307, the first epitaxial layer 303, and the n+ substrate 301. The buried layer 305 forms the emitter of the avalanche diode, the p+ implant layer 307 forms the base of the avalanche diode, and the first epitaxial layer 303 and n+ substrate 301 collectively form the collector of the avalanche diode.

Isolation trenches 311, 311', 311" formed within the second epitaxial layer 309 and first epitaxial layer 303 isolate the low-side steering diode LSD from the high-side steering diode HSD integrated with the avalanche diode. First, second, third, and fourth n+ source regions 319, 319', 319", 319'" are formed within the second epitaxial layer 309, as illustrated. An optional n-type sinker region 317 may be formed between the second source region 319' and the n+ buried layer 305 to allow the avalanche diode to form a connection at the top surface of the device 300 and improve the clamping of the N+ source to the substrate 301 in both positive and negative biased modes of operation. A pair of p+ implant regions 321, 321' are formed within a top portion of the second epitaxial layer 309. The high side diode HSD is formed by the first p+ implant region 321, the second epitaxial layer 309 and the n+ buried layer 305. The first p+ implant region 321 and second epitaxial layer 309 collectively form the anode of the high-side steering HSD diode and the n+ buried layer 305 forms the cathode of the high-side steering diode HSD. The cathode of the high side steering diode HSD is electrically connected to the emitter of the avalanche diode through the n+ buried layer 305.

The low-side steering diode LSD is formed by the third source region 319", the second epitaxial layer 309, and the second p+ implant region 321'. The second p+ implant region 321' and the second epitaxial layer 309 collectively form the anode of the low-side steering diode LSD and the third source region 319" forms the cathode of the low-side steering diode LSD. Unlike the low-side steering diode in the prior art described in FIG. 2A, this low-side steering diode LSD is integrated laterally rather than vertically. However, the lateral integration of the low-side steering diode LSD does not significantly contribute the device package size, and as such the invented TVS 300 is still able to retain a desirable small device package size.

The avalanche diode (i.e., N-P-N structure) operates differently than the Zener diode in the conventional TVS 200. The breakdown of the Zener diode in the conventional TVS 200 depends on the doping concentration of the p+ implant region and is limited by reverse leakage current issues. The breakdown voltage of the avalanche diode in the TVS 200' depends on the breakdown voltage of the P-N junction (i.e., junction between P+ implant layer 307 and N+ buried layer 305) and the gain of the N-P-N structure. The breakdown voltage of the avalanche diode is directly proportional to the breakdown voltage of the P-N junction and inversely proportional to the gain of the N-P-N structure. As such, the doping concentration of the p+ implant layer 307 may remain at a level necessary to prevent reverse leakage current, while the gain of the N-P-N is adjusted in order to obtain a desired TVS breakdown voltage. The gain of the N-P-N structure is dependent on the thickness of the base, which in this case is the p+ implant layer 307. By decreasing the thickness and doping concentration of this p+ implant layer 307, the breakdown voltage of the TVS may also be effectively decreased. Thus, the breakdown voltage of the TVS may be reduced below 6V to support a wider range of applications by decreasing the thickness of the p+ implant layer 307. Because the clamping voltage of the TVS is heavily dependent on the breakdown voltage, it too may also be effectively reduced by adjusting the gain of the avalanche diode (i.e., reducing the thickness of p+ implant layer 307).

The TVS device 200' retains the low capacitance as well as the small device packaging of its predecessor. By integrating an N-P-N structure in place of the Zener diode into a TVS, the breakdown voltage of the TVS may be reduced to 6V. This in turn reduces the clamping voltage to a desirable level without causing unwanted reverse leakage current. Additionally, such a TVS retains the low capacitance and small device packaging of the prior art device 200 using the techniques discussed above. A TVS with an integrated N-P-N avalanche diode as set forth in U.S. Pat. No. 8,698,196 continues to operate and function as described above with respect to the circuit diagram in FIG. 1, albeit with the improved behavioral characteristics described above.

However, the transient voltage suppression of TSV devices of the type described in U.S. Pat. No. 8,698,196 is still limited by the utilization of the avalanche breakdown mechanism. The breakdown voltage of the prior art devices cannot be reduced below about 6V. Additionally, such devices are unable to control snapback, wherein the breakdown provides a sufficient base current to turn on a transistor. Also, the method of forming the prior art TSV devices makes it difficult to control the doping profile layers of the breakdown mechanism structure utilized. Thus, there is a need for a device wherein a lower breakdown voltage can be utilized, and also wherein the snapback can be separately controlled is needed.

It is within this context that aspects of the present disclosure arise.

TVS Devices with Reduce Breakdown Voltage

In order to create a device wherein a lower breakdown voltage can be utilized, and also wherein the snapback can be separately controlled, a punch-through mode for breakdown is utilized in embodiments of the present invention. This breakdown mode can be implemented using very low doping concentration and a very narrow doping profile.

The TVS 300 in FIG. 3A exhibits improved device behavior characteristics over the TVS described in U.S. Pat. No. 8,698,196. By integrating a punch-through N-P-N structure in addition to the original N-P-N avalanche diode structure, the breakdown voltage of the TVS 300 may be reduced to between 3-5V using the techniques described above. This in turn reduces the clamping voltage to a desirable level without causing unwanted reverse leakage current. Additionally, the TVS 300 retains desirable low capacitance and small device packaging associated with prior art devices as discussed above. The TVS 300 continues to operate and function as described above with respect to the circuit diagram in FIG. 1, albeit with the improved behavioral characteristics described above.

FIGS. 3A-3D illustrate cross-sectional schematic diagrams of transient voltage suppressor (TVS) device in accordance with aspects of the present disclosure. These TVS devices are configured to provide low capacitance and small device package size while further improving breakdown voltage by providing a punch through mode, in addition to providing snapback control. In devices of the type shown in FIGS. 3A-3D, punch through takes place at a lower voltage than the avalanche diode established by the HSD through a forward biased diode HSD2. As the voltage increases above the avalanche breakdown, the avalanche diode turns on and controls the snap back. Punch through mode operation aside, the TVS devices shown in FIGS. 3A-3D behave substantially in accordance with the TVS 100 described above with respect to FIG. 1, but additionally provide a punch-through mode for breakdown at a lower voltage. The Punch through NPN provide a lower TVS breakdown voltage (3-5V), and original NPN avalanche diode control the snap back, therefore, the design of the TVS device 300 allows for independent control of breakdown voltage and snap back, which is a big advantage and can't be achieved with the TVS structures 200 and 200'.

In FIG. 3A, a TVS device 300 is formed on a heavily doped semiconductor substrate of a first conductivity type 401 which supports a first epitaxial layer 403 and a second epitaxial layer 409. In the illustrated, the semiconductor substrate 401 may be an n+ substrate; however aspects of the present disclosure are not limited to such implementations. An n+ substrate 401 may be used rather than a p+ substrate in order to integrate the avalanche diode as an N-P-N structure rather than a P-N diode. The N-P-N structure exhibits certain behavioral characteristics that make it more advantageous for use in a TVS than a P-N diode. These advantages will be discussed in further detail below. The N-P-N structure will also be referred to as the avalanche diode hereinafter.

The first epitaxial layer 403 is a lightly doped n-layer. This first epitaxial layer 403 may be doped with phosphorous having a concentration on the order of $2 \times 10^{16}/\text{cm}^3$. The second epitaxial layer 409 is a very lightly doped n-layer. This second epitaxial layer 409 may be doped with Boron, having a minimal doping concentration on the order of $10^{14}/\text{cm}^3$ or lower. Because the doping concentration of the second epitaxial layer 409 contributes significantly to the capacitance of both the high-side steering diode HSD and low-side steering diode LSD it is desirable to set the doping concentration of this layer 409 as low as possible. The capacitances of the steering diodes HSD, LSD will contribute significantly to the overall capacitance of the TVS 300 because the steering diodes HSD, LSD are connected in parallel to the avalanche diode. Thus, the capacitances of the steering diodes HSD, LSD may be used to effectively lower the overall TVS 300 capacitance to a desired value regardless of the capacitance of the avalanche diode.

In the example TVS shown in FIG. 3A, an n+ buried layer 405 is formed within the first epitaxial layer 403. This n+ buried layer 405 forms the cathode of the high-side steering diode HSD, to be described in more detail below. Additionally, in the example TVS of FIG. 3A, a p+ implant layer 407 is implanted within the first epitaxial layer 403 below the n+ buried layer 405. The p+ implant layer 407 extends laterally beyond the n+ buried layer 405. The avalanche diode is formed by the n+ buried layer 405, the p+ implant layer 407, the first epitaxial layer 403, and the n+ substrate 401. The buried layer 405 forms the emitter of the avalanche diode, the p+ implant layer 407 forms the base of the avalanche diode, and the first epitaxial layer 403 and n+ substrate 401 collectively form the collector of the avalanche diode.

The avalanche diode (i.e., N-P-N structure) in the TVS 300 illustrated behaves differently than the Zener diode in the conventional TVS 200. Whereas the breakdown voltage behavior of the Zener diode in the conventional TVS 200 was solely dependent on the doping concentration of the p+ implant region and limited by reverse leakage current issues, the breakdown voltage of the avalanche diode in the invented TVS 300 lends itself to more flexibility. The breakdown voltage of the avalanche diode is dependent on two different factors: the breakdown voltage of the P-N junction (i.e., junction between P+ implant layer 407 and N+ buried layer 405) and the gain of the N-P-N structure. The breakdown voltage of the avalanche diode is directly proportional to the breakdown voltage of the P-N junction and inversely proportional to the gain of the N-P-N structure. As such, the doping concentration of the p+ implant layer 407 may remain at a level necessary to prevent reverse leakage current, while the gain of the N-P-N is adjusted in order to obtain a desired TVS breakdown voltage. The gain of the N-P-N structure is dependent on the thickness of the base, which in this case is the p+ implant layer 407. By decreasing the thickness of this p+ implant layer 407, the breakdown voltage of the TVS may also be effectively decreased. Thus, the breakdown voltage of the TVS may be reduced to 6V to support a wider range of applications by decreasing the thickness of the p+ implant layer 407. Because the clamping voltage of the TVS is heavily dependent on the breakdown voltage, it too may also be effectively reduced by adjusting the gain of the avalanche diode (i.e., reducing the thickness of p+ implant layer 407).

A set of isolation trenches 415, 415', 415" are formed within both the second epitaxial layer 409 and the first epitaxial layer 403 and filled with dielectric material 417 (e.g., silicon oxide). The isolation trenches 415, 415', 415" are configured to isolate the low-side steering diode LSD from the high-side steering diode HSD integrated with the avalanche diode. The first isolation trench 415 may be located at an edge of the N+ buried layer 405 and an edge of the p+ implant layer 407. The second isolation trench 415' may be located at another edge of the N+ buried layer 405 and extending into the p+ implant layer 407. The third isolation trench 415" may be located at another edge of the p+ implant layer 407.

A set of n+ source regions 424, 424', 424", 424''' are formed within the second epitaxial layer 409. The first source region 424 is located to the left of the first isolation trench 415, as illustrated. The second source region 424' is located between the first isolation trench 415 and second isolation trench 415'. The third source region 424" is located between the second isolation trench 415' and the third isolation trench 415". The fourth source region 424''' is located adjacent the right sidewall of the third isolation trench 415".

A pair of p+ implant regions 411, 411' are formed within the top layer of the second epitaxial layer 409. The first p+ implant region 411 is located between the second and third source regions 424', 424". The second p+ implant region 411' is located adjacent the left sidewall of the third isolation trench 415".

A punch-through p implant region 413 is formed within the top layer of the second epitaxial layer 409. The punch-through p implant region 413 is located adjacent to the left sidewall of the first isolation trench 415 and below the first source region 424. A depletion region increases as the doping profile of the punch-through p-region 413 is reduced. If the punch-through p-region 413 has a sufficiently low doping concentration and is sufficiently narrow in the vertical dimension, the punch through mode can easily happen because electric field easily penetrates through the punch-through p-region between the N-second epitaxial layer 409 and the N+ source region 424. Thus, the breakdown voltage of the TVS may be reduced 5 V to support a wider range of applications by decreasing the thickness and doping concentration of the p+ implant layer 413.

The high side diode HSD is formed by the first p+ implant region 411, the second epitaxial layer 409 and the n+ buried layer 405. The first p+ implant region 411 and second epitaxial layer 409 collectively form the anode of the high-side steering HSD diode and the n+ buried layer 405 forms the cathode of the high-side steering diode HSD. The cathode of the high side steering diode HSD is electrically connected to the emitter of the avalanche diode through the n+ buried layer 405.

The low-side steering diode LSD is formed by the third source region 424", the second epitaxial layer 409, and the second p+ implant region 411'. The second p+ implant region 411' and the second epitaxial layer 409 collectively form the anode of the low-side steering diode LSD and the third source region 424" forms the cathode of the low-side steering diode LSD. Unlike the low-side steering diode in the prior art described in FIG. 2A, this low-side steering diode LSD is integrated laterally rather than vertically. However, the lateral integration of the low-side steering diode LSD does not significantly contribute the device package size, and as such the invented TVS 300 is still able to retain a desirable small device package size.

The second lateral high side PN diode (HSD2) is formed by the first implant region 411, the second epitaxial layer 409, and the second source region 424'. The first implant region 411 and the second epitaxial layer 409 collectively form the anode of the second lateral diode HSD2 and the second source region 424' forms the cathode of the lateral high side diode (HSD2).

The punch-through structure is formed by the first source region 424, the punch-through p implant region 413, and the second epitaxial layer 409. An N-sink structure 423 may be formed adjacent to the right sidewall of the third isolation trench 415" to provide an electrical path to connect the substrate 401 to ground potential. Additionally, p+ contact regions 429 and 429''' may be formed with the p+ implant regions 411 and 411', respectively.

Additionally, an isolation layer 430 may be formed above the second epitaxial layer 409 with openings formed therein to provide for metal contacts to components of the TVS device 300. The isolation layer 430 may include, for example borophosphosilicate glass (BPSG) formed on low-temperature oxide (LTO). An I/O pad formed by a conductive layer (not shown) may make contact to p+ contact region 429 and p+ implant region 411 (i.e., anode of high-side steering diode) through an opening in the isolation layer. Additionally, the conductive layer that forms the I/O pad may make contact to the third source region 424" (i.e., the cathode of low-side steering diode) through another opening in the isolation layer. Furthermore, a GND pad formed by a conductive layer (not shown) may make contact to the second implant region 411' and fourth source region 424''' through yet another opening in the isolation layer 430.

Figure 3B:
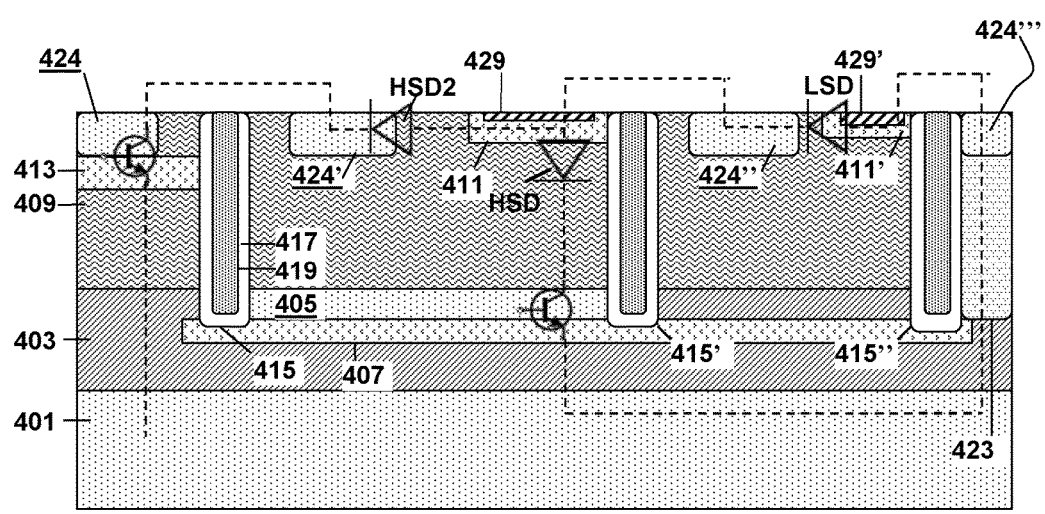
FIG. 3B is a cross-sectional schematic diagram illustrating a transient voltage suppressor (TVS) device in accordance with an alternative embodiment of the present invention.
Figure 3C:
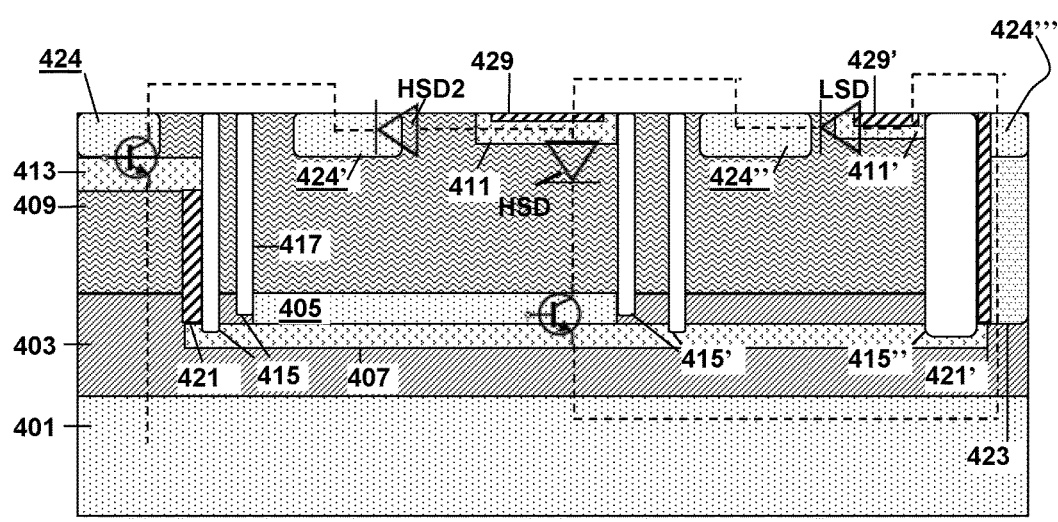
FIG. 3C is a cross-sectional schematic diagram illustrating a transient voltage suppressor (TVS) device in accordance with an alternative embodiment of the present invention.
Figure 3D:
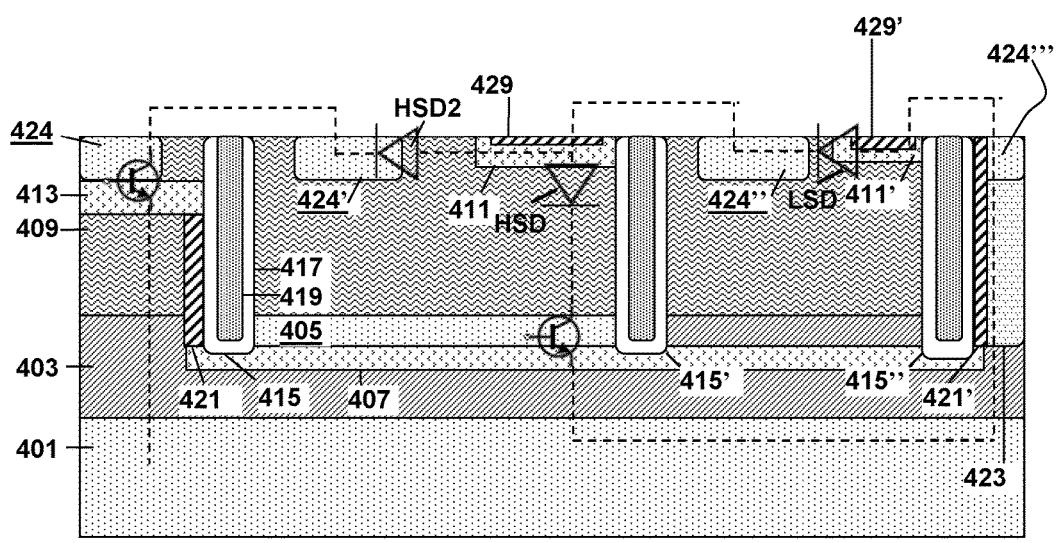
FIG. 3D is a cross-sectional schematic diagram of the transient voltage suppressor in FIG. 3C with the addition of a top-surface insulating layer and corresponding metal pads for forming electrical connections in accordance with an embodiment of the present invention.

FIGS. 3B-3D illustrate alternative embodiments of the transient voltage suppressor (TVS) device described above with respect to FIG. 3A. For the sake of simplicity, the isolation layer 430 is not shown in FIGS. 3B-3D.

FIG. 3B illustrates a transient voltage suppressor (TVS) device 300' in accordance with an alternative aspect of the present disclosure. The TVS 300' retains the same structure as the TVS 300 in FIG. 3A, except for the addition of a polysilicon filling 419 within each isolation trench 415, 415', 415". Each isolation trench 415, 415', 415" is first lined with a thin layer of dielectric 417, e.g., oxide, and the remainder is subsequently filled with polysilicon 419. The process of filling a trench 415, 415', and 415" with polysilicon 419 rather than oxide greatly simplifies the manufacturing process. Lining the trenches with oxide and filling them with polysilicon is easier than filling the trenches with oxide and avoids a complex process that tends to introduce high stress in the resulting structure.

FIG. 3C is a cross-sectional schematic diagram illustrating a transient voltage suppressor (TVS) device 300" in accordance with another alternative aspect of the present disclosure. The TVS 300" retains the same structure as the TVS 300' in FIG. 3A except for the addition of p-sink regions 421 and 421' extending from the second epitaxial layer 409 through the first epitaxial layer 403. The p-sink region 421 is located within the second epitaxial layer 409 and first epitaxial layer 403 below the punch-through p implant region 413 and adjacent to the left sidewall of the first isolation trench 415. The p-sink region 421' is located within the second epitaxial layer 409 and first epitaxial layer 403 adjacent to the right sidewall of the third isolation trench 415". Both p-sink regions 421 and 421' terminate in the p+ implant layer 407. These p-sink regions 421 and 421' serve the purpose of connecting the p+ implant layer to ground to prevent leakage. This TVS 300" continues to operate and function as described above with respect to the circuit diagram in FIG. 1, but additionally provides a punch-through mode for breakdown at a lower voltage.

FIG. 3D is a cross-sectional schematic diagram of a transient voltage suppressor 300''' according to yet another aspect of the present disclosure. The transient voltage suppressor 300''' is basically the in FIG. 3B having the filled isolation trenches but with the addition of the p-sink regions 421 and 421' of FIG. 3C.

Figure 4A:
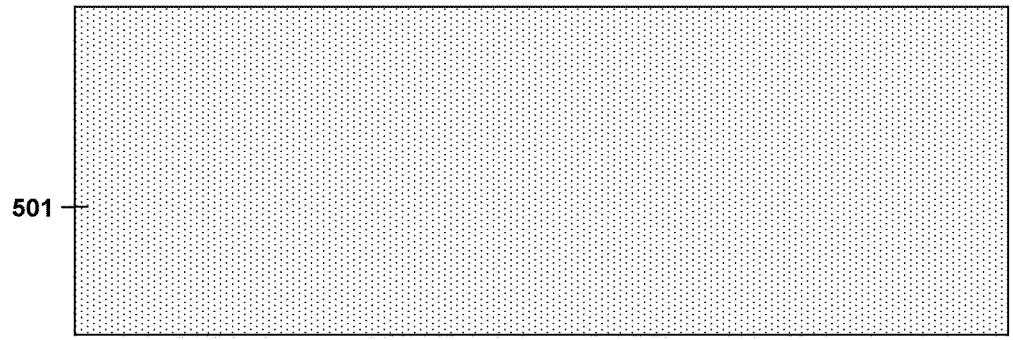
FIGS. 4A-4P illustrate a method for forming the TVS device depicted in FIG. 3D according to an embodiment of the present invention.
Figure 4B:
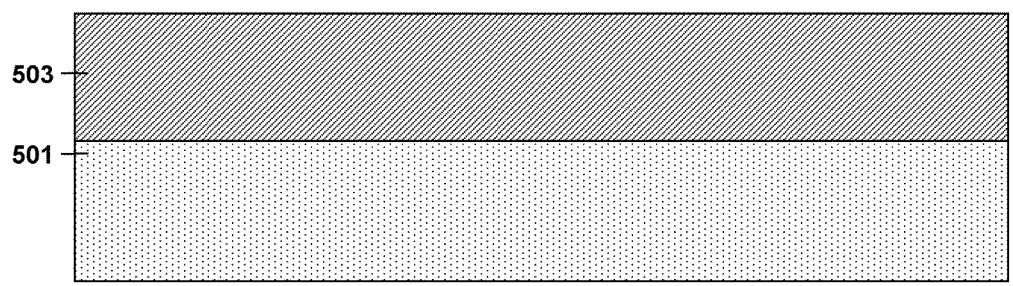
Figure 4C:
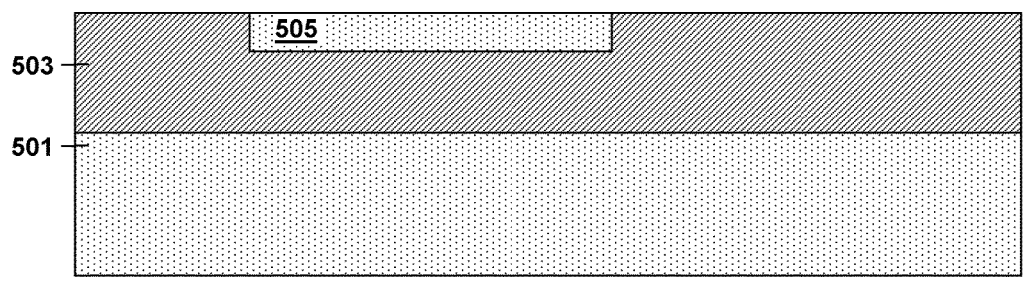
Figure 4D:
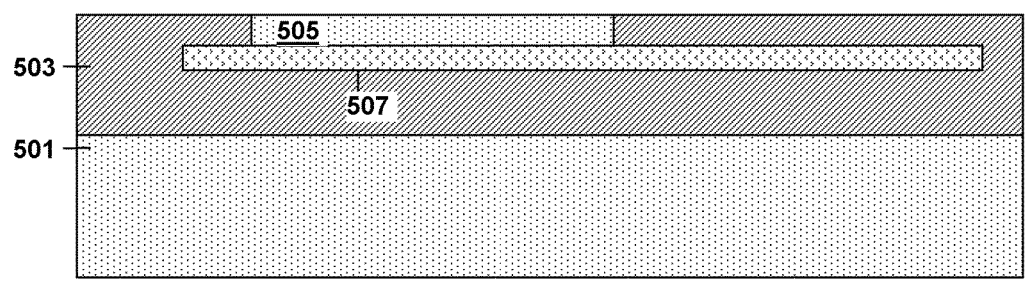
Figure 4E:
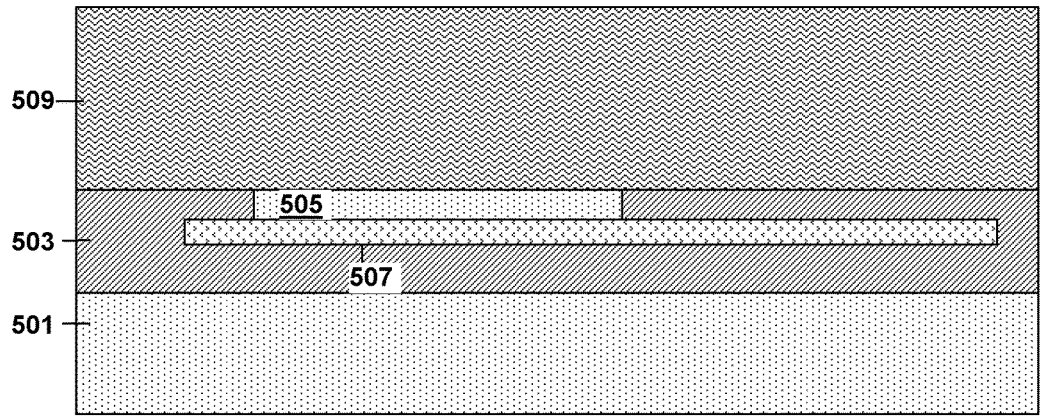
Figure 4F:
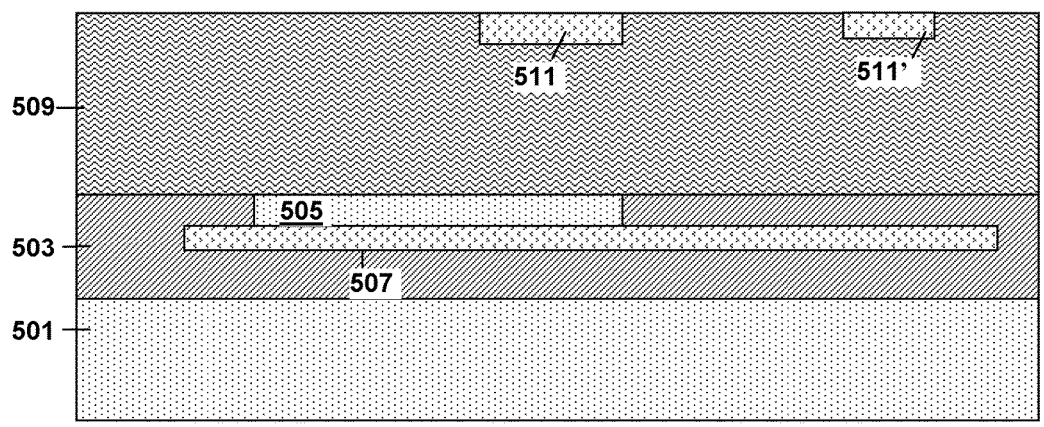
Figure 4G:
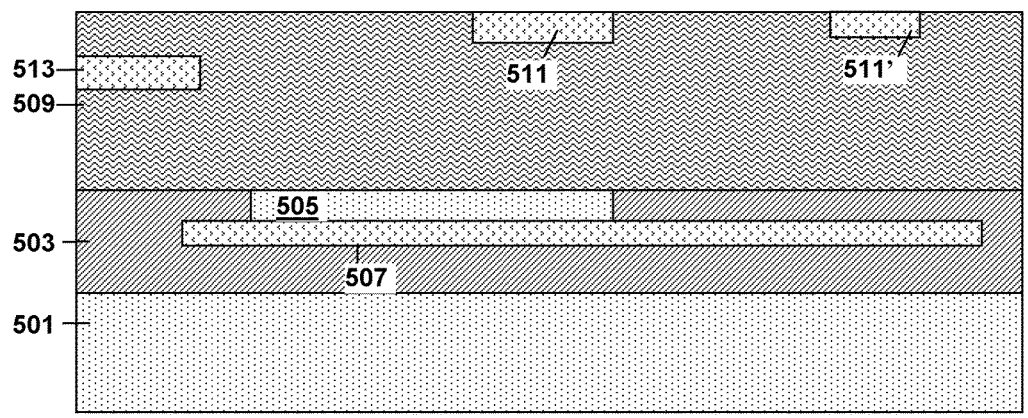
Figure 4H:
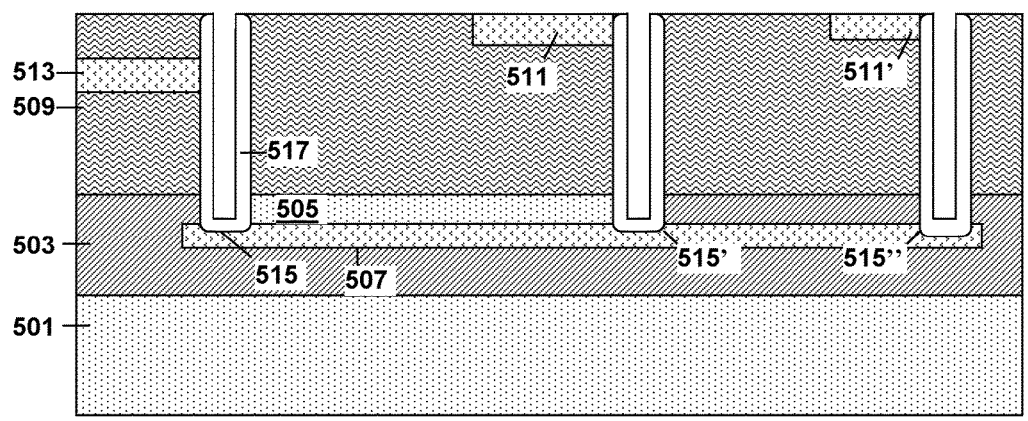
Figure 4I:
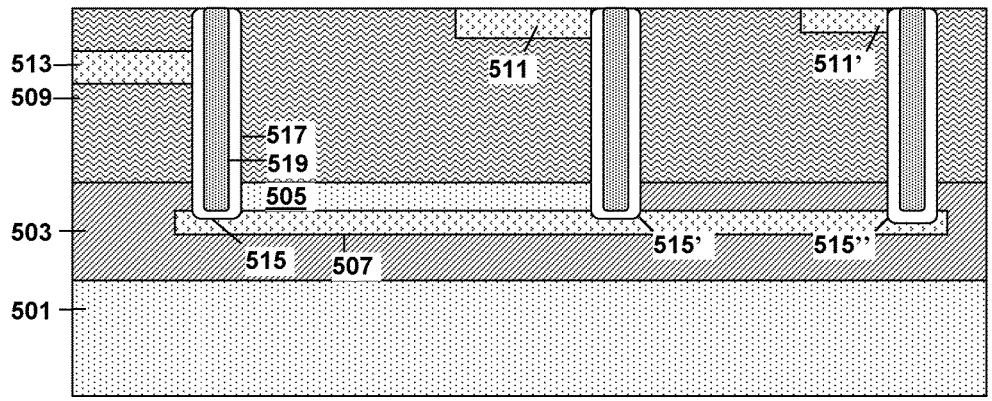
Figure 4J:
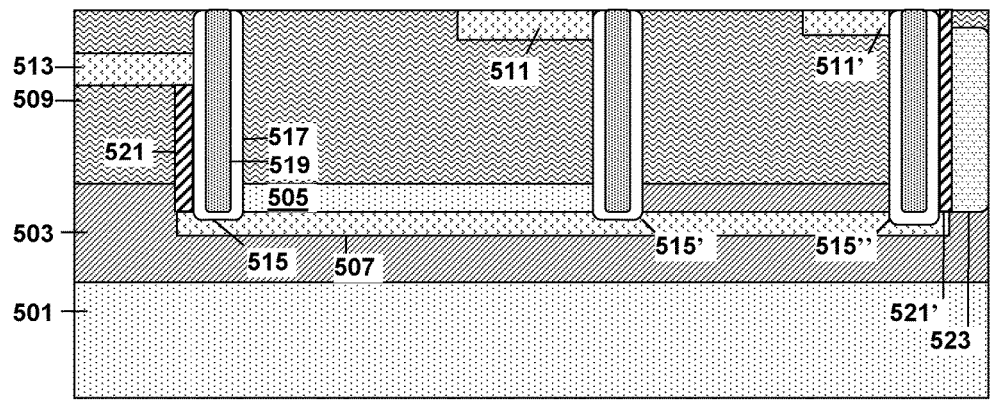
Figure 4K:
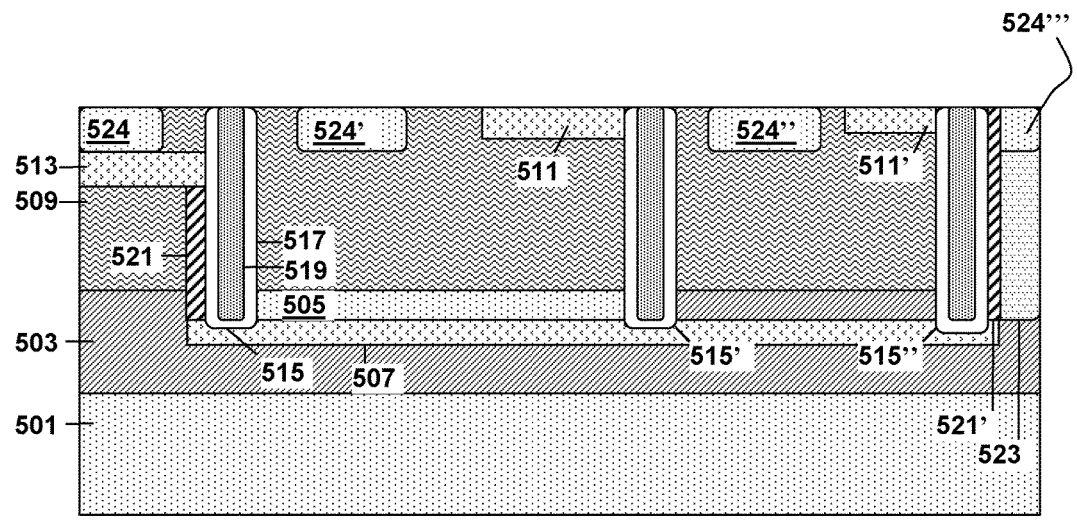
Figure 4L:
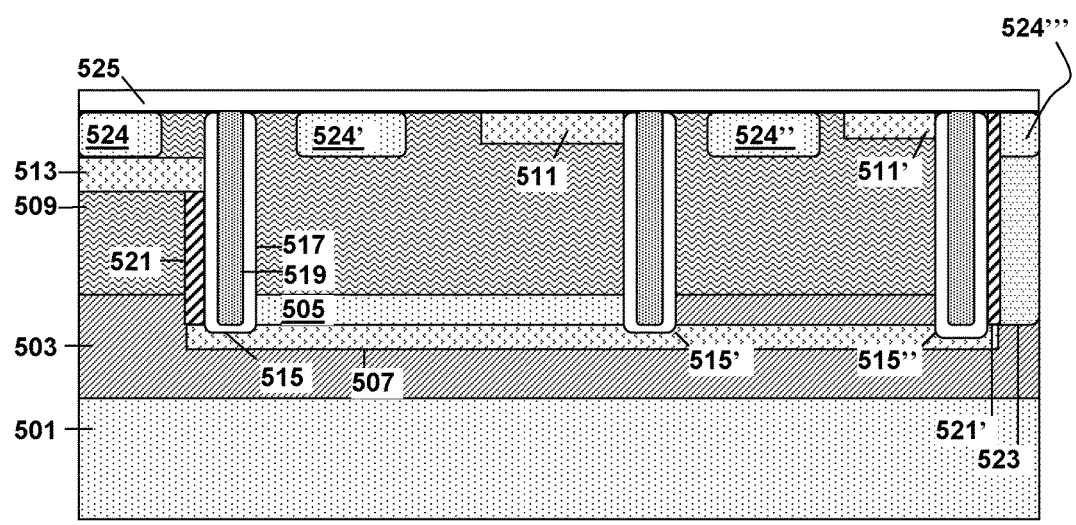
Figure 4M:
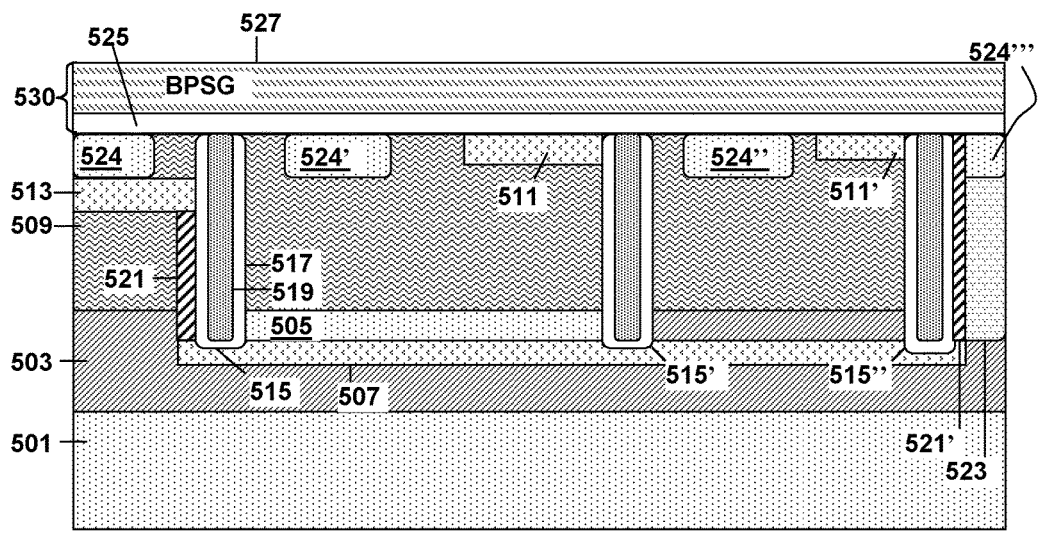
Figure 4N:
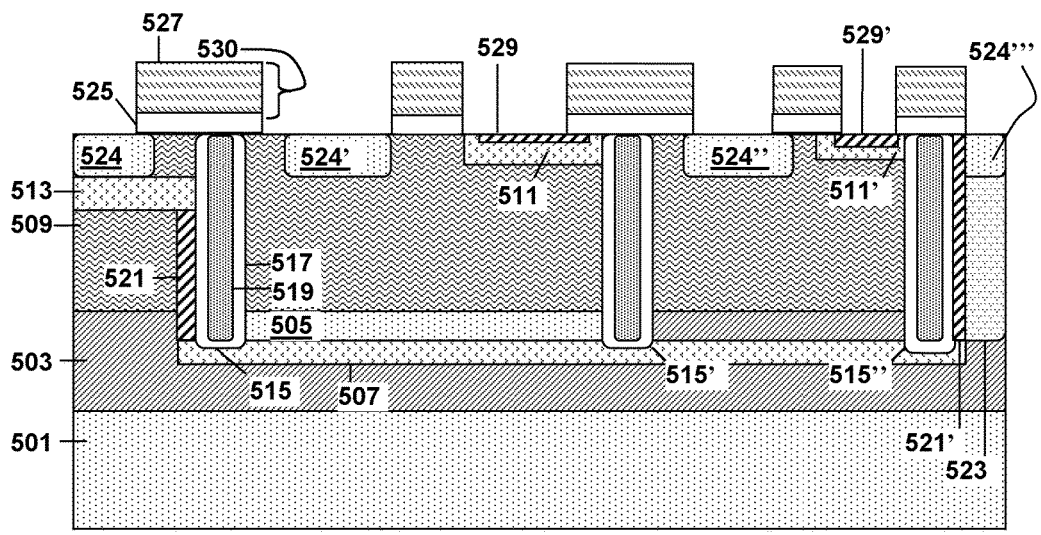
Figure 4O:
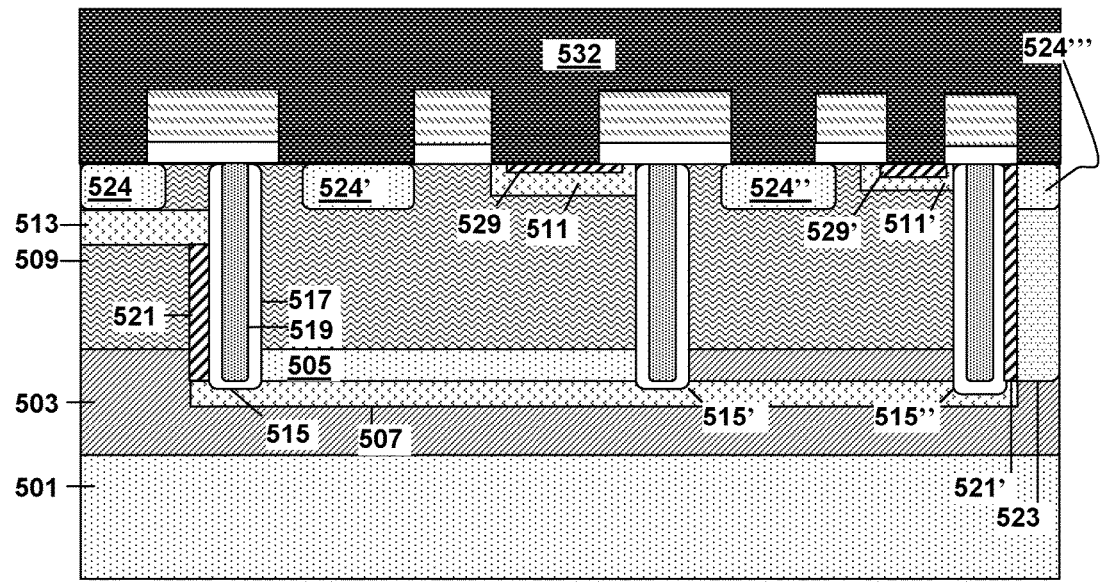
Figure 4P:
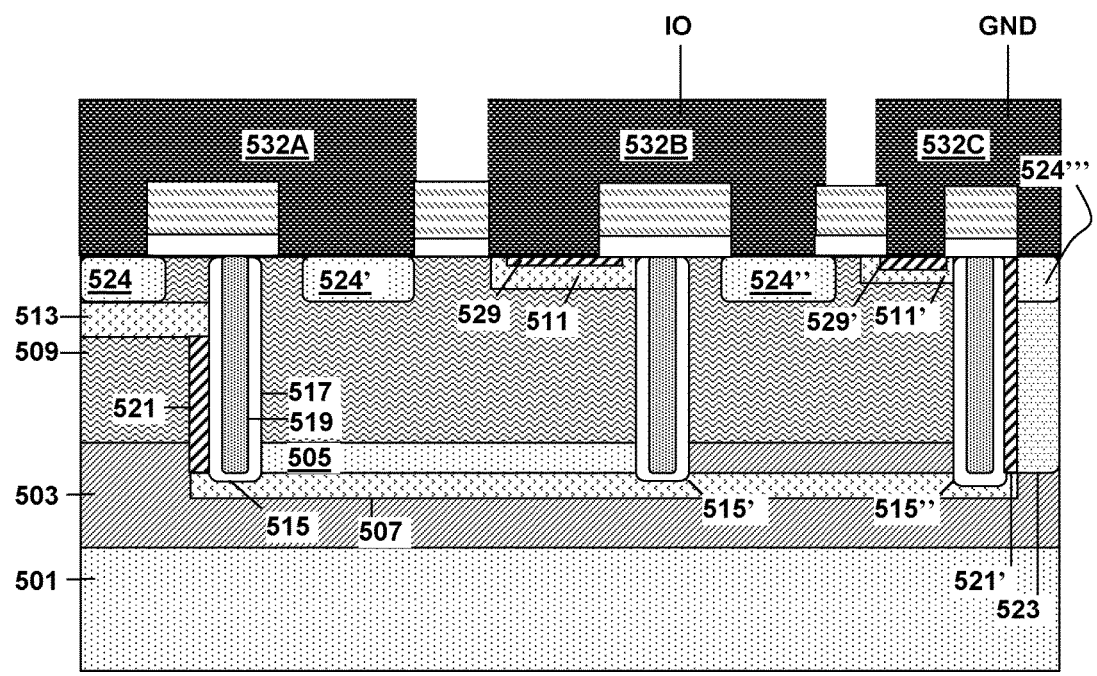

FIGS. 4A-4P illustrate a method for forming the TVS device depicted in FIG. 3D above. While, the diagrams and description will refer only to the TVS device depicted in FIG. 3D, one ordinarily skilled in the art will recognize that this fabrication method may be easily extended for any of the TVS devices described above by including additional standard processing steps. It is further noted that although only a single device is shown for the sake of convenience, those skilled in the art will recognize that the fabrication sequence in FIGS. 4A-4P can be applied to integrated circuits having multiple such devices arranged in device cells. Additionally, while the specific conductivity types of the materials utilized are provided in the examples below, those skilled in the art will recognize that the conductivity types can be interchanged and doping concentrations may be different than those mentioned in specific examples.

The TVS device begins with a substrate of a first conductivity type 501 (e.g., silicon wafer) as illustrated in FIG. 4A. In the example TVS device shown in FIGS. 4A-4P, the substrate used is an n+ type substrate. This is in contrast to the p+ type substrate used for most TVS devices. A first epitaxial layer 503 is grown over the n+ type substrate 501 as illustrated in FIG. 4B. The first epitaxial layer 503 may be a lightly doped n-type epitaxial layer. The first epitaxial layer 503 and the n+ substrate 503 will collectively form the collector of the N-P-N device.

A masked implant (mask not shown) is subsequently performed to form an n+ buried layer 505 as illustrated in FIG. 4C. This n+ buried layer 505 will later act as the cathode of the high-side steering diode HSD and the emitter of the N-P-N avalanche diode. The n+ buried layer 505 only extends along a portion of the length of the first epitaxial layer.

Another masked implant (mask not shown) is then performed to form a p+ implant layer 507. This p+ implant layer 507 will later act as the base of the N-P-N avalanche diode. This p+ implant layer 507 extends beyond the length of the n+ buried layer 505 in order to prevent the low-side steering diode LSD from being short-circuited. The p+ implant is performed following the n+ implant because it requires a higher energy implant to achieve the desired result.

In FIG. 4E, a second epitaxial layer 509 is grown on top of the first epitaxial layer 503. The second epitaxial layer 509 may be a lightly doped n-epitaxial layer. As discussed above, the doping concentration of the second epitaxial layer 509 significantly controls the capacitance of the steering diodes, and as such it is desirable to minimize the doping concentration in order to achieve low device capacitance. Additionally, this second epitaxial layer will later act as the emitter of the N-P-N punch-through structure.

A pair of p+ implant regions 511, 511' are then implanted using a mask (mask not shown) within the top surface of the second epitaxial layer 509 as illustrated in FIG. 4F. The first p+ implant region 511 and the second epitaxial layer 509 collectively form the anode of the vertical high-side steering diode HSD and anode of second lateral diode HSD2, while the n+ buried layer 505 forms the cathode of the vertical high-side steering diode HSD. The second p+ implant region 511' and the second epitaxial layer 509 form the anode of the lateral low-side steering diode LSD.

A punch-through p implant region 513 is then implanted using a mask (mask not shown) within the top surface of the second epitaxial layer 509 as illustrated in FIG. 4G. The breakdown voltage of the punch-through structure can be controlled by controlling the depth and doping concentration of the punch-through p-implant 513. The implant depth can be controlled by adjusting the implantation energy. Greater implant energy results in greater depth of implant. The doping concentration can be adjusted by controlling the dose of ions implanted. A greater ion dose produces a higher doping concentration. Reducing the doping concentration and/or reducing the thickness of the punch-through p-implant region reduces the punch-through breakdown voltage, therefore low TVS breakdown voltage. The done in a separate step from the two p+ implants 511, 511', which can be done at the same time as each other. By way of example, and not by way of limitation, the two p+ implants 511, 511' may be done at an energy of about 600 KeV with a dose of about $3\times10^{11}/cm^2$. The punch-through p-implant 513, by contrast may be done at a slightly higher energy, e.g., 660 KeV with a dose ranging from $5\times10^{11}/cm^2$-$8\times10^{11}/cm^2$, depending on desired TVS breakdown voltage.

A set of three isolation trenches 515, 515', and 515" are formed within the first epitaxial layer 503 and the second epitaxial layer 509 as illustrated in FIG. 4H. The isolation trenches 515, 515', 515" may be etched using a hard mask (mask not shown) to a depth of approximately 7 microns such that the bottom of the trench is positioned just above the substrate 501. The first isolation trench 515 may be located at an edge of the N+ buried layer 505 and an edge of the p+ implant layer 507, and the left sidewall of trench 515 may be adjacent to the punch-through p implant region 513. The second isolation trench 515' may be located at another edge of the N+ buried layer 505 and extending into the p+ implant layer 507, and the left sidewall of trench 515' may be adjacent to the p+ implant region 511. The third isolation trench 515" may be located at another edge of the p+ implant layer 507 and the left sidewall of trench 515" may be adjacent to the p+ implant region 511'. A layer of oxide 517 may then optionally be deposited or grown along the walls of the isolation trench to a thickness of about 50 nm, as shown in FIG. 4I. The remainder of the isolation trench 515 is filled with polysilicon 519. Any excess polysilicon may be removed using an etch-back process. FIG. 4I illustrates the device after oxide growth and polysilicon deposition.

As shown in FIG. 4J, P-sink implant regions 521, 521' may optionally be implanted with a mask (not shown) within the second epitaxial layer 509 and first epitaxial layer 503. The p-sink region 521 is located within the second epitaxial layer 509 and first epitaxial layer 503 below the punch-through p implant region 513 and adjacent to the left sidewall of the first isolation trench 515. The p-sink region 521' is located within the second epitaxial layer 509 and first epitaxial layer 503 adjacent to the right sidewall of the third isolation trench 515". Both p-sink regions 521 and 521' terminate in the p+ implant layer 507. As shown in FIG. 4J an N-sink region 523 may also be implanted to provide an electrical path to connect the substrate 501 to ground potential. The N-sink may be implanted with a separate mask (not shown) in a separate implant step.

A set of four source regions 524, 524', 524", 524''' may then be implanted within a top surface of the second epitaxial layer 509 using another mask (not shown) as illustrated in FIG. 4K. The first source region 524, the punch-through p implant region 513 and an underlying part of the second epitaxial layer 509 form the punch-through structure. The second source region 524' becomes the cathode of the lateral diode HSD2, with the first p+ implant region 511 and the second epitaxial layer 509 collectively making up the anode of the lateral diode HSD2. The third source region 524" becomes the cathode of the lateral low-side steering diode LSD. The fourth source region 524''' provides a contact for the n-sink region 523.

An isolation layer 530 may be formed in two stages as shown in FIG. 4L-FIG. 4M A first insulating layer 525 (e.g., silicon dioxide) may be optionally formed on top of the second epitaxial layer 509 as illustrated in FIG. 4L, e.g., by a low temperature process. Subsequently, a layer of second insulating layer 527, e.g., borophosphosilicate glass (BPSG), may be formed on the first insulating layer 525 to form the isolation layer 530, as shown in FIG. 4M.

Openings may be formed in the isolation layer 530, e.g., using conventional masking and etching techniques, to provide points of contact to the TVS device, as shown in FIG. 4N. These openings may include an opening for a contact to the first source region 524 above the punch-through implant region to allow for a contact to be made to the punch-through structure. A second opening may be formed above the second source region 524' in order to allow for a contact to be made to the anode of the snapback diode. A third opening may be formed above the first p+ implant region 524" to allow for a contact to be made to the cathode of the low-side diode. An additional opening may be formed above the fourth source region 524''' in order to allow for a ground contact to be made to the substrate 501 via the n-sink region 523. Additional openings may be formed above the p+ implant regions 511, 511' to allow for electrical connections to be made to the anode of the lateral low-side steering diode and the anode of the avalanche diode. As shown in FIG. 4N, p+ contact regions 529 and 529' may be embedded into the p+ implant layers 511 and 511', through openings in the isolation layer 530 to facilitate electrical contact.

A layer of metal 532 may be formed over the isolation layer 530 to provide electrical contacts/connections to the components of the TVS, as shown in FIG. 4O. The metal layer 532 may be divided into first, second, and third regions 523A, 532B, 523C that are electrically isolated from each other, as shown in FIG. 4P. The first region 523A allows for electrical contact between the cathode of the snap back diode and the punch-through structure. The second region 523B allows for an I/O electrical contact to the cathode of the low-side diode and the anode of the high side diode. The third region 523C provides an electrical ground contact to the anode of the low-side diode and to the substrate 501 via the fourth source region 524''' and the N-sink region 523.

As discussed above, also the steps discussed above for TVS fabrication shown in FIGS. 4A-4P are for the TVS device depicted in FIG. 3D. In alternative implementations, TVS devices, such as those shown in FIGS. 3A-3C may be fabricated by varying the process of FIGS. 4A-4P, e.g., with different process steps, different masks, or some combination of both. For example, the device of FIG. 3A may be fabricated using the process of FIGS. 4A-4P but with a different trench mask to form the isolation trenches 415, a different process step to fill the trenches with dielectric, and omitting the masking and implantation used in forming p-sink regions 521, 521'. Furthermore, the device of FIG. 3B may be fabricated using the process of FIGS. 4A-4P but omitting the masking and implantation used in forming p-sink regions 521, 521'. In addition, the device of FIG. 3C may be fabricated including the masking and implantation used in forming p-sink regions 521, 521' but with a different trench mask to form the isolation trenches 415 and a different process step to fill the trenches with dielectric.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6

What is claimed is:

1. A method for manufacturing a transient voltage suppressor (TVS) device, comprising:
    a) forming a first epitaxial layer of a first conductivity type on top of a semiconductor substrate of the first conductivity type;
    b) forming a buried layer of a semiconductor material of the first conductivity type within a top surface of the first epitaxial layer;
    c) forming an implant layer of semiconductor material of a second conductivity type within the first epitaxial layer, wherein the implant layer is located below the buried layer and a length of the implant layer extends beyond a length of the buried layer;
    d) forming a second epitaxial layer of semiconductor material of the first conductivity type on top of the first epitaxial layer;
    e) forming a pair of implant regions of semiconductor material of a second conductivity type within the top surface of the second epitaxial layer;
    f) forming a punch-through implant region of semiconductor material of a second conductivity type within the top surface of the second epitaxial layer
    g) forming a set of source regions of semiconductor material of a first conductivity type within a top surface of the second epitaxial layer, the set of source regions including a first source region located above the punch-through implant region, a second source region located between the first source region and a first of the implant regions, a third source region located between the first implant region and a second implant region and a fourth source region located such that the second implant region is located between the third and fourth source regions, wherein the first implant region is located between the second source region and the third source region, wherein a vertical PN junction is formed by the first source region, the punch-through implant region and second epitaxial layer, a lateral PN junction being formed by the second source region, second epitaxial layer and first implant region, and a lateral PN junction being formed by the third source region, second epitaxial layer and second implant region.

2. The method of claim 1, further comprising forming a sink region of a p-type semiconductor material formed within the second epitaxial layer, the sink region being located below the punch through implant region and between the first source region and the second source region.

3. The method of claim 1, wherein the first conductivity type is N and the second conductivity type is P.

4. The method of claim 1, further comprising forming a sink region of a n-type semiconductor material within the second epitaxial layer, the sink region being located below the fourth source region.

5. The method of claim 4, further comprising forming a sink region of a p-type semiconductor material within the second epitaxial layer, the sink region being located adjacent the sink region of the n-type semiconductor material.

6. The method of claim 1, wherein the first epitaxial layer is made of an n-type semiconductor material.

7. The device of claim 6, wherein the semiconductor material of the buried layer is a heavily doped n-type semiconductor material having a higher concentration of n-type dopants than the first epitaxial layer.

8. The method of claim 6, wherein the semiconductor material of the first epitaxial layer is an n-type material having a lower n-type doping concentration than the substrate.

9. A transient voltage suppressor (TVS) device comprising:
    a) a semiconductor substrate of a first conductivity type;
    b) a first epitaxial layer of a semiconductor material first of the first conductivity type on the substrate;
    c) a buried layer of semiconductor material of the first conductivity type located within the first epitaxial layer;
    d) an implant layer of a semiconductor material of a second conductivity type located within the first epitaxial layer below the buried layer, the implant layer extending laterally beyond the buried layer, an NPN junction being formed by the buried layer, implant layer, first epitaxial layer and substrate;
    e) a second epitaxial layer of semiconductor material of a first conductivity type supported on top of the first epitaxial layer;
    f) a pair of implant regions of semiconductor material of a second conductivity type within the top surface of the second epitaxial layer;
    g) a punch-through implant region of semiconductor material of a second conductivity type within the top surface of the epitaxial layer; and
    h) a set of source regions of semiconductor material of a first conductivity type formed within a top surface of the second epitaxial layer, the set of source regions including a first source region located above the punch-through implant region, a second source region located between the first source region and a first of the implant regions, a third source region located between the first implant region and a second implant region and a fourth source region located such that the second implant region is located between the third and fourth source regions, wherein the first implant region is located between the second source region and the third source region, wherein a vertical PN junction is formed by the first source region, the punch-through implant region and second epitaxial layer, a lateral PN junction being formed by the second source region, second epitaxial layer and first implant region, and a lateral PN junction being formed by the third source region, second epitaxial layer and second implant region.

10. The device of claim 9, further comprising a sink region of a p-type semiconductor material formed within the second epitaxial layer, the sink region being located below the punch through implant region and between the first source region and the second source region.

11. The device of claim 9, wherein the substrate is a heavily doped n-type semiconductor substrate.

12. The device of claim 9, further comprising a sink region of an n-type semiconductor material formed within the second epitaxial layer, the sink region being located below a fourth source region.

13. The device of claim 12, further comprising a sink region of a p-type semiconductor material formed within the second epitaxial layer, the sink region of the p-type semiconductor material being located adjacent the sink region of the n-type semiconductor material.

14. The device of claim 9, wherein the first conductivity type is N and the second conductivity type is P.

15. The device of claim 14, wherein the semiconductor material of the first epitaxial layer is an n-type material having a lower n-type doping concentration than the substrate.

* * * * *